US011229139B2

(12) United States Patent
Bailey et al.

(10) Patent No.: US 11,229,139 B2
(45) Date of Patent: Jan. 18, 2022

(54) ISOLATING INFORMATION HANDLING SYSTEM RACKS FROM SHOCK AND VIBRATION IN A MODULAR DATA CENTER

(71) Applicant: DELL PRODUCTS, L.P., Round Rock, TX (US)

(72) Inventors: Mark M. Bailey, Round Rock, TX (US); Anthony P. Middleton, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/661,097

(22) Filed: Oct. 23, 2019

(65) Prior Publication Data

US 2021/0127523 A1  Apr. 29, 2021

(51) Int. Cl.
*H05K 7/14* (2006.01)
*H05K 7/18* (2006.01)

(52) U.S. Cl.
CPC ......... *H05K 7/1495* (2013.01); *H05K 7/1489* (2013.01); *H05K 7/1491* (2013.01); *H05K 7/1494* (2013.01); *H05K 7/183* (2013.01)

(58) Field of Classification Search
CPC .. H05K 7/1495; H05K 7/1489; H05K 7/1491; H05K 7/1494; H05K 7/183; H05K 7/1497
See application file for complete search history.

(56) References Cited

U.S. PATENT DOCUMENTS

| 2,270,335 A * | 1/1942 | Parkinson | F16F 3/10 |
| | | | 267/140.2 |
| 2006/0254997 A1 | 11/2006 | Pellegrino et al. | |
| 2008/0060790 A1 * | 3/2008 | Yates | F16F 7/14 |
| | | | 165/80.3 |
| 2011/0094978 A1 * | 4/2011 | Bailey | H05K 7/18 |
| | | | 211/26.2 |
| 2012/0113570 A1 | 5/2012 | Yang et al. | |
| 2016/0029508 A1 | 1/2016 | Tabe et al. | |
| 2018/0058086 A1 * | 3/2018 | Hubbard | E04B 1/98 |
| 2019/0141852 A1 * | 5/2019 | Anderson | H05K 7/1495 |
| 2019/0145120 A1 | 5/2019 | Hubbard et al. | |
| 2019/0239370 A1 | 8/2019 | Chen et al. | |

* cited by examiner

*Primary Examiner* — James Wu
(74) *Attorney, Agent, or Firm* — Isidore PLLC

(57) ABSTRACT

A modular data center includes a container for housing at least one rack containing an information handling system. A frame is disposed within the container. The frame has several upper cross-members and several lower cross-members. A floor is coupled to the lower cross-members and the at least one rack is disposed on an upper surface of the floor. At least one lower bracket extends between the floor and the first rack and is affixed to the floor and a first rack to couple/secure the first rack to the floor. Several first isolators are mounted between the floor and the lower cross-members. The first isolators protect the first rack from mechanical shock and vibration.

18 Claims, 13 Drawing Sheets

ISOLATING INFORMATION HANDLING SYSTEM RACKS FROM SHOCK AND VIBRATION IN A MODULAR DATA CENTER

BACKGROUND

1. Technical Field

The present disclosure generally relates to information handling systems and in particular to isolating information handling system racks from shock and vibration.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A modular data center contains data center equipment such as information handling systems, storage, and networking equipment that are typically housed in a container that is transported to a desired location. A modular data center typically also includes power and cooling systems. The data center equipment, such as components of the information handling systems, are housed within one or more racks positioned between a cold aisle and a hot aisle of the container. During shipping or transportation, the racks can be subject to vibration and motion. Unfortunately, the vibration and motion can cause possible damage to components of the information handling systems housed within the rack.

BRIEF SUMMARY

Disclosed are an information handling system (IHS), a modular data center (MDC), and a method of manufacturing a MDC that provides isolation of IT racks from shock and vibrations.

According to one embodiment, a modular IHS includes a container for housing at least one rack containing the IHS. A frame is disposed within the container. The frame has several upper cross-members and several lower cross-members. A floor is coupled to the lower cross-members and the at least one rack is disposed on an upper surface of the floor. At least one lower bracket extends between the floor and a first rack and is affixed to the floor and the first rack from among the at least one rack to couple the first rack to the floor. Several lower isolators are mounted between the floor and the lower cross-members. Several upper isolators are mounted between the top of the first rack and the upper cross-members. The lower and upper isolators protect the first rack from mechanical shock and vibration.

According to a next embodiment, an MDC includes a container for housing at least one rack containing information technology (IT) equipment, such as a component of an IHS. A frame is disposed within the container. The frame has several upper cross-members and several lower cross-members. A floor is coupled to the lower cross-members and the at least one rack is disposed on an upper surface of the floor. At least one lower bracket extends between the floor and a first rack and is affixed to the floor and the first rack from among the at least one rack and couples the first rack to the floor. Several first isolators are mounted between the floor and the lower cross-members. Several upper isolators are mounted between the top of the first rack and the upper cross-members. The lower and upper isolators protect the first rack from mechanical shock and vibration.

According to another embodiment, a method of manufacturing an MDC includes providing a frame having a floor, a rack for containing at least one IHS, several lower isolators, several upper isolators, an isolator mounting assembly, an upper bracket and a lower bracket. The lower isolators are attached between the frame and the floor and the upper isolators are attached between the frame and the isolator mounting assembly. The rack is positioned into the frame and onto the floor. The lower bracket is coupled between the rack and the floor. The upper bracket is coupled between the rack and the isolator mounting assembly.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
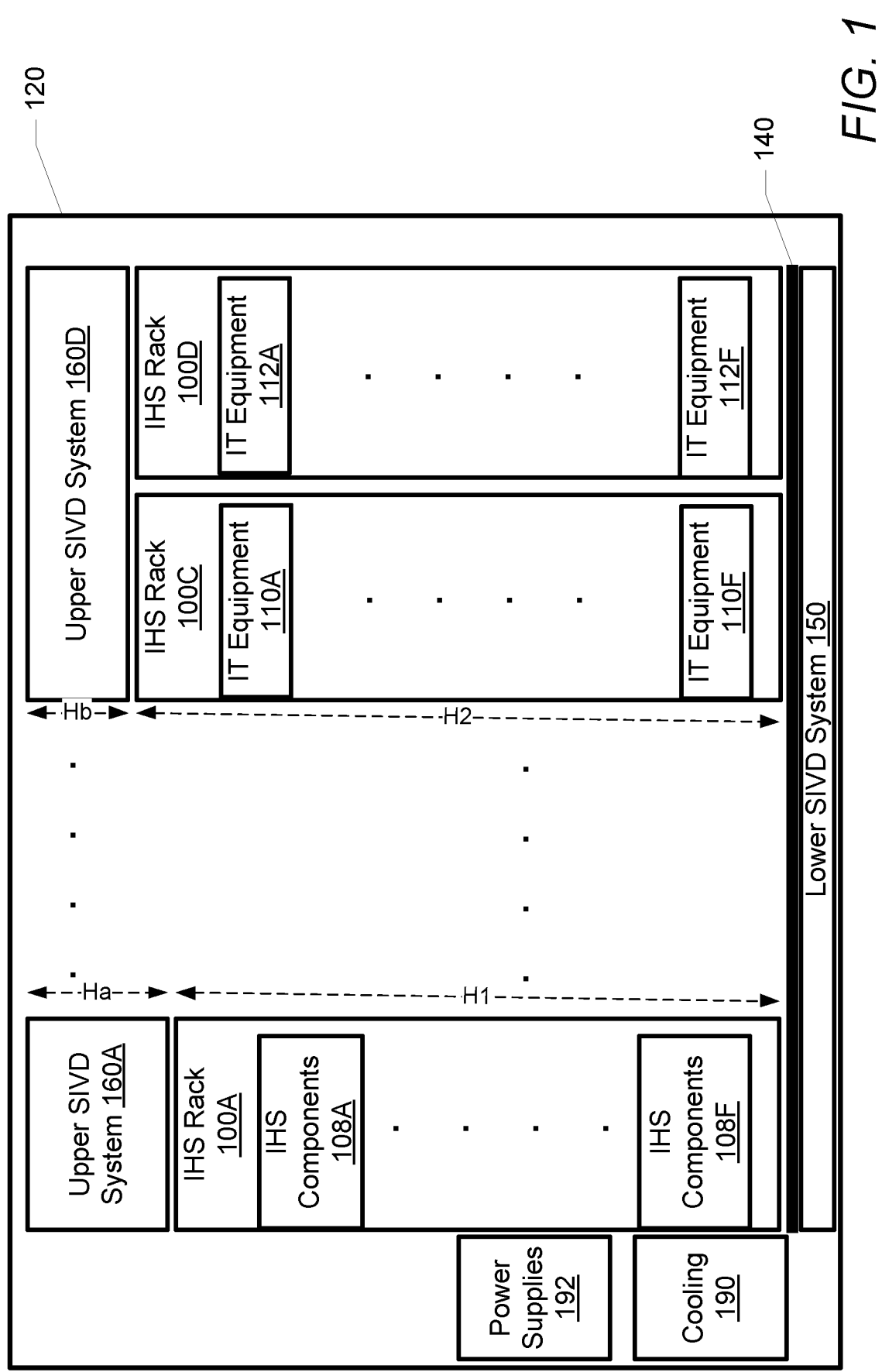
FIG. 1 provides a block diagram representation of an example modular data center (MDC) having a plurality of information technology (IT) racks or rack information handling systems (RIHS) secured within the MDC container, according to one or more embodiments.

The illustrative embodiments provide an information handling system (IHS), a modular data center (MDC) and a method of manufacturing a MDC that provides isolation of IT racks from shock and vibrations. The MDC includes a container for housing at least one rack containing information technology (IT) equipment that can be a component of an IHS. A frame is disposed within the container. The frame has several upper cross-members and several lower cross-members. A floor is coupled to the lower cross-members and the at least one rack is disposed on an upper surface of the floor. At least one lower bracket extends between the floor and a first rack and is affixed to the floor and the first rack from among the at least one rack and couples the first rack to the floor. Several lower isolators are mounted between the floor and the lower cross-members. Several upper isolators are mounted between the top of the first rack and the upper cross-members. The lower and upper isolators protect the first rack from mechanical shock and vibration.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a block diagram representation of an example modular data center (MDC) 120, within which one or more of the described features of the various embodiments of the disclosure can be implemented. MDC 120 includes a plurality of information handling systems (IHS) racks 100A-D, which can each house information technology (IT) equipment, such as an IHS or one or more components of an IHS. For purposes of this disclosure, an information handling system, such as can be housed within IHS rack 100A-D, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, MDC 120 includes IHS racks 100A-D. IHS racks 100A-D house and contain various information processing equipment such as IT equipment 110A-F and 112A-F and IHS components 108A-F. MDC 120 further comprises one or more cooling devices 190 and power supplies 192. Cooling devices 190, such as one or more fans, can cool IT equipment 110A-F and 112A-F and IHS racks 100A-D and IHS components 108A-F of MDC 120 housed within IHS racks 100A-D during operation. Power supplies 192 can supply regulated power to IT equipment 110A-F and 112A-F and to IHS components 108A-F. MDC 120 further includes lower shock isolation and vibration damping (SIVD) system 150 and upper SIVD system 160A-D. Lower SVID System 150 is located under a floor 140 that supports IHS racks 100A-D.

Upper SIVD System 160A-D is located between the top of IHS racks 100A-D and a ceiling of MDC 120. Each of the IHS racks 100A-D can have a different height. In the embodiment shown in FIG. 1, IHS rack 100A has a height H1 and IHS racks 100C and 100D have a height H2. The corresponding upper SIVD systems are configured to span the space between top of the rack and the cross bars (not shown) of the ceiling of MDC 120. Upper SIVD System 160A has a height Ha that spans the space between the top of the rack and the cross bars (not shown) of the ceiling of MDC 120. Upper SIVD Systems 160D has a height Hb that spans the space between the top of the rack and the cross bars (not shown) of the ceiling of MDC 120. Lower SIVD System 150 and Upper SIVD System 160A-D enable IHS racks 100A-D and other components of MDC 120 to be insulated or isolated from shock and vibration forces.

Figure 2:
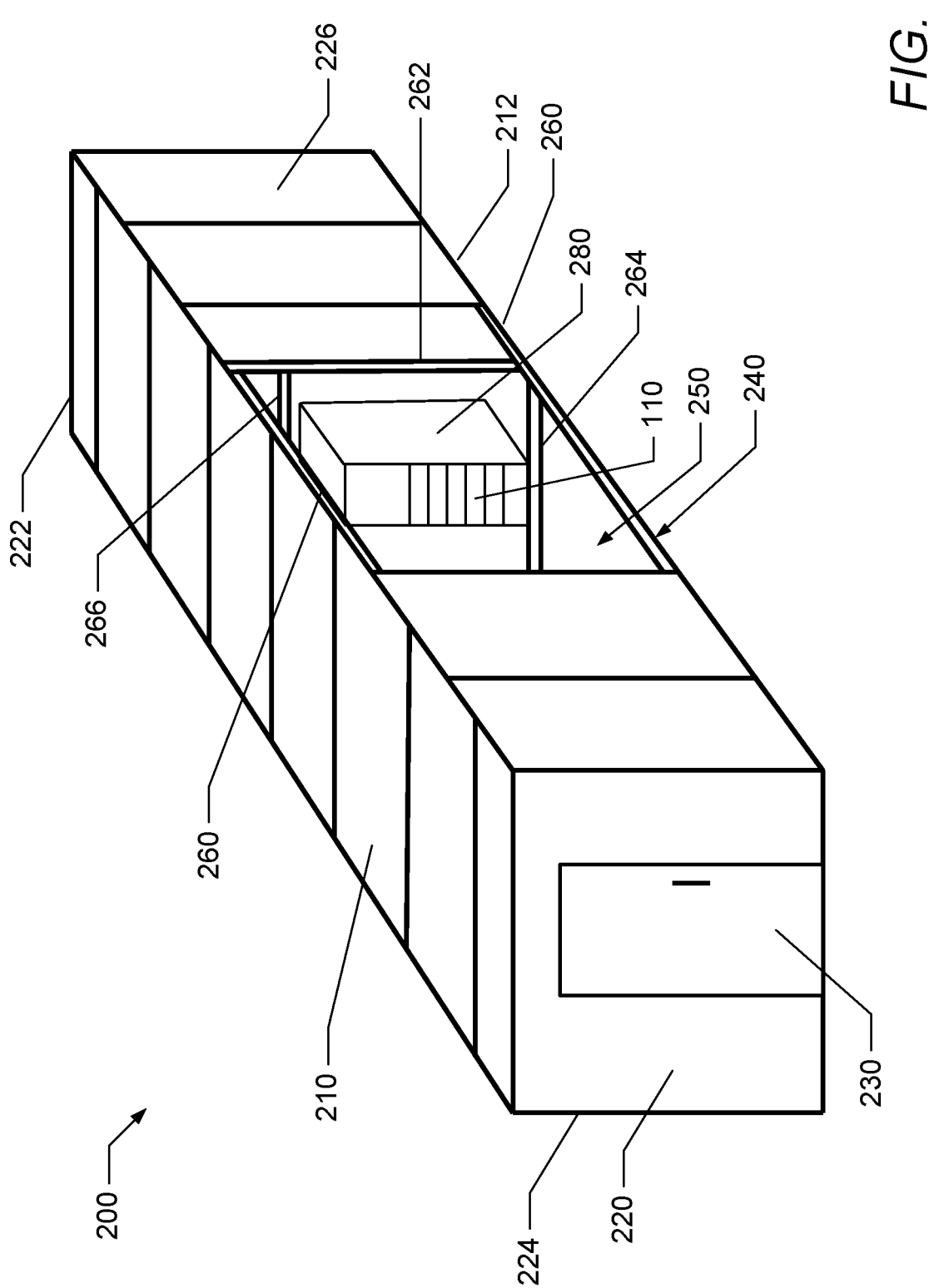
FIG. 2 illustrates a perspective view of a MDC container with a portion of a side wall removed to expose an IT rack or rack information handling system (RIHS) disposed inside the container, according to one or more embodiments.

In the discussion of the following figures, the description of each figure can include general reference to the specific components illustrated within the preceding figures. Turning to FIG. 2, MDC container 200 is shown with a rack disposed therein for housing IHS components. Examples of information handling system components that can be housed within a rack include, but are not limited to, computing nodes, server blades, input/output (I/O) modules, storage devices, and network cards (all generally referred to hereinafter as IT equipment). MDC container 200 can package and contain the various components of MDC 120 and IHS racks 100A-D. MDC container 200 includes upper wall 210, lower wall 212, front wall 220, back wall 222, and side walls 224 and 226. A frame 240 is located within MDC container 200. Walls 210, 212, 220, 222, 224 and 226 are mounted to frame 240. An interior space 250 is defined within MDC container 200. Frame 240 comprises several lower and upper rails 260, side members 262, lower cross-members 264 and upper cross-members 266. Side members 262 extend between lower and upper rails 260. Lower cross-members 264 and upper cross-members 266 also extend between lower and upper rails 260. In FIG. 2, only the lower and upper rails 260 on the right side of container 200 are shown. Corresponding lower and upper rails 260 are also present on the left side of container 200, but not shown in FIG. 2.

MDC 120 includes one or more racks 280 (similar to IHS racks 100, FIG. 1) mounted in and contained within interior space 250. Rack 280 is a structure that can house or contain one or more IT equipment 110A-F and 112A-F, such as server IHS(s), and/or IHS components 108A-F of MDC 120. Rack 280 can provide power, cooling, networking, and/or management infrastructure to one or more of IT equipment 110A-F, 112A-F and IHS components 108A-F. Door 230 is located in front wall 220 and provides access to interior space 250 of MDC 120. For simplicity, IT equipment 110A-F, 112A-F and IHS components 108A-F are hereinafter collectively referenced as IT equipment 110, as a representative one of the various types of possible components.

Figure 3:
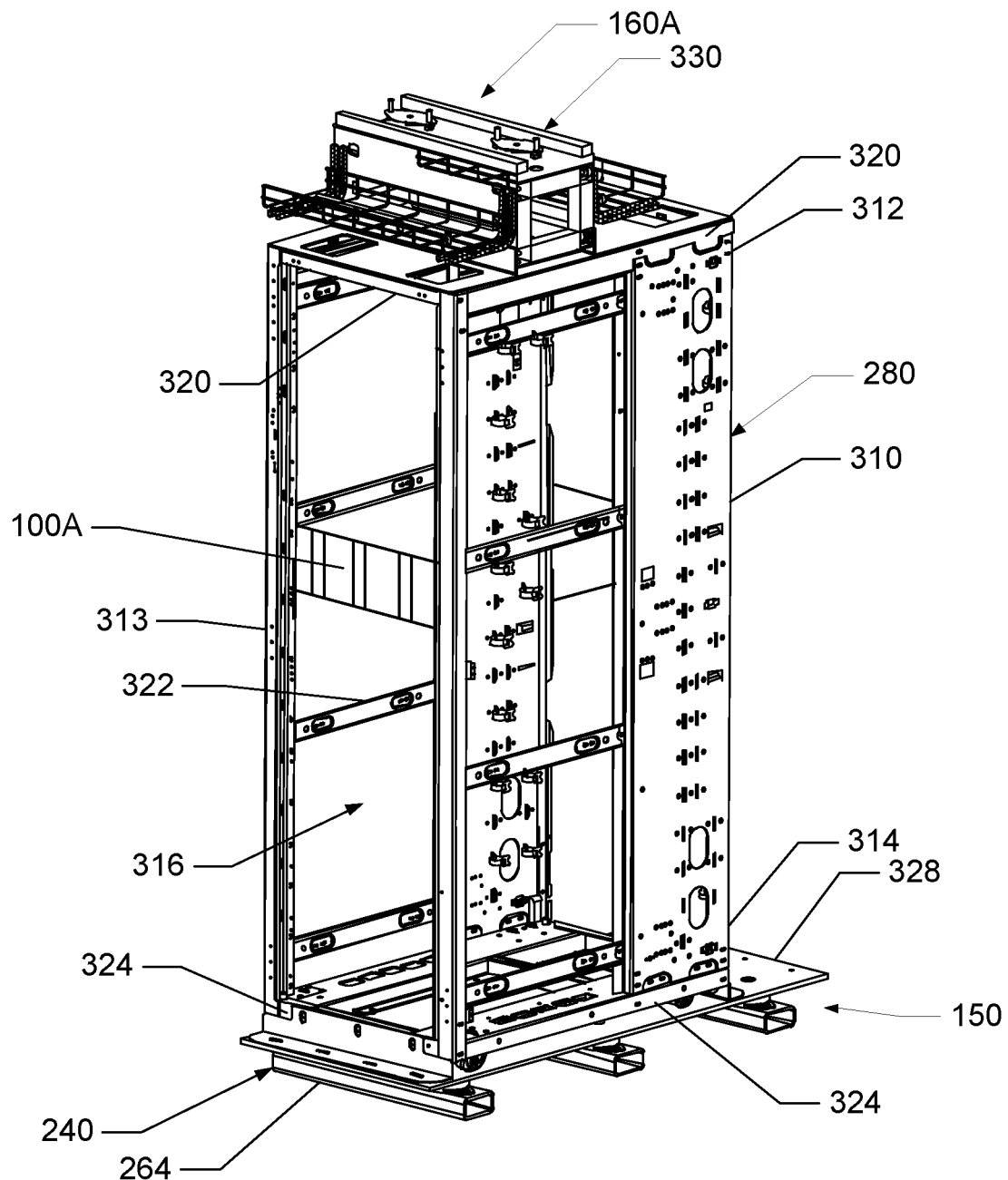
FIG. 3 illustrates a perspective, isolated view of a rack attached to upper and lower shock isolation and vibration damping (SIVD) systems provided for isolating the rack from shock and vibration, according to one or more embodiments.

With reference to FIG. 3, there is shown rack 280 attached to upper SIVD system 160A and lower SIVD system 150. Rack 280 includes chassis 310 having IT equipment 110 mounted therein. Chassis 310 is generally rectangular in shape and has a top 312 and a bottom 314. Chassis 310 can be formed from suitable materials, such as metal. Interior space 316 is defined within chassis 310. Chassis 310 comprises vertical columns 313 that are coupled to generally horizontal upper cross-bars 320, middle cross-bars 322 and bottom cross-bars 324. Upper SIVD system 160A includes isolator mounting assembly 330 mounted to the top 312 of chassis 310. Rack 280 rests on a floor 328. Lower SIVD system 150 includes floor 328 mounted over and coupled to lower cross-members 264 of MDC container 200 (FIG. 2).

Figure 4:
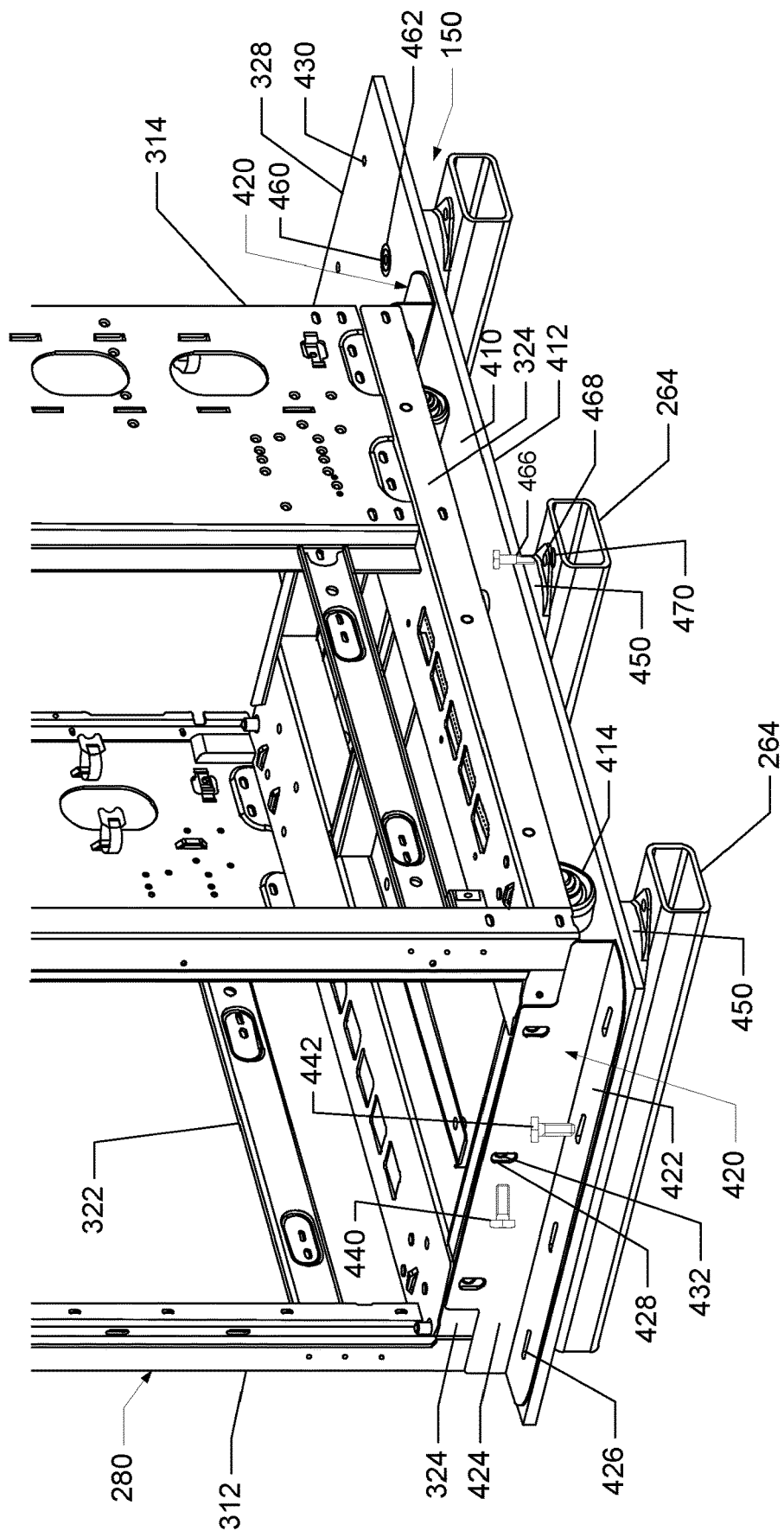
FIG. 4 illustrates an enlarged perspective view of the bottom of the rack of FIG. 3, attached to the lower SIVD system, according to one or more embodiments.

Referring to FIG. 4, details of the bottom of rack 280 attached to the lower SIVD system 150 are shown. Floor 328 has an upper surface 410 and a bottom surface 412. Several wheels (or casters) 414 are mounted to bottom cross-bars 324 of rack 280. Wheels 414 rests on upper surface 410 of floor 328 and allow rack 280 to be rolled on upper surface 410 of floor 328. To secure rack 280 in place and/or prevent lateral or rotational movement of rack 280, rack 280 is coupled to floor 328 by a pair of lower brackets 420. Each lower bracket 420 is mounted on opposite sides of rack 280. Each lower bracket 420 is generally L-shaped and includes a base segment 422 and an upright segment 424. Slots 426 are defined in base segment 422 and apertures 428 are defined in upright segment 424. First threaded holes 430 are located in floor 328 and second threaded holes 432 are located in lower cross-bars 324. In one embodiment, first holes 430 and/or second holes 432 may not be threaded and can be used with fasteners such as nuts and bolts or rivets. Lower bracket-to-rack fasteners 440 extend through apertures 428 and are received in second threaded holes 432 in order to couple lower bracket 420 to lower cross-bars 324. Bracket-to-floor fasteners 442 extend through slots 426 and are received in first threaded holes 430 in order to couple lower bracket 420 to floor 328. Additional details about fasteners are presented with the description of FIGS. 5A-5B.

Lower SVID system 150 further includes several lower isolators 450 mounted between the lower surface 412 of floor 328 and lower cross-members 264. Lower isolators 450 isolate or separate rack 280 from shock and vibration conveyed through lower cross-member 264 of frame 240 (FIG. 3) during movement or shipping of MDC container 200. Attachment holes 462 are located in and extend through floor 328. Floor-to-isolator attachment fasteners 460 extend through attachment holes 462 and are received in threaded holes (described later) of lower isolators 450 thereby coupling lower isolators 450 to floor 328. Flange holes 468 are located in a top portion of lower isolators 450. Isolator-to-frame attachment fasteners 466 extend through flange holes 468 and are received in third threaded holes 470 of lower cross-members 264 thereby coupling lower isolators 450 to lower cross-members 264 and frame 240.

Figure 5B:
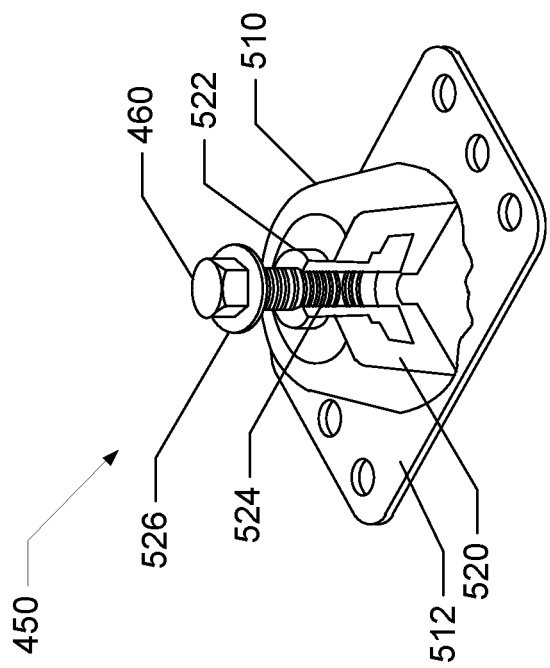
FIG. 5B illustrates a cut-away view of the isolator of FIG. 5A, according to one or more embodiments.
Figure 5A:
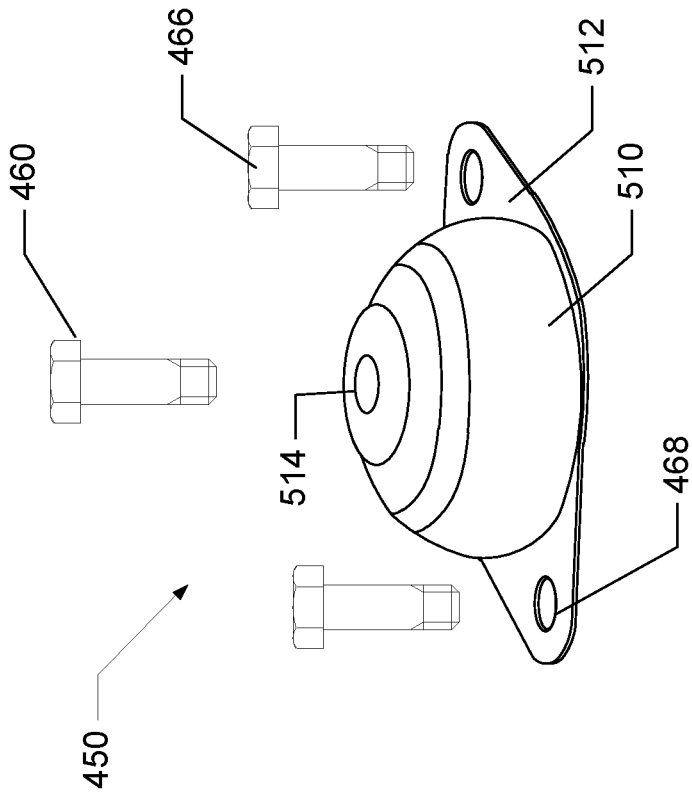
FIG. 5A illustrates a perspective view of an isolator utilized within the SIVD system, according to one or more embodiments.

FIGS. 5A and 5B illustrate additional details of lower isolators 450 and the various fasteners provided in FIG. 4. With specific reference to FIG. 5A, lower isolators 450 include an outer shell 510. A pair of flanges 512 extend away from opposite sides of a bottom portion of outer shell 510. A flange hole 468 is located in each flange 512. Floor-toisolator attachment fasteners 460 are received in attachment holes 462 (FIG. 4) in floor 328 and screwed into a threaded bore 524 (FIG. 5B), securing floor 328 to lower isolator 450. Isolator-to-frame attachment fasteners 466 extend through flange holes 468 and are received in third threaded holes 470 (FIG. 4) of lower cross-members 264 (FIG. 2), thereby coupling lower isolators 450 to lower cross-members 264 (FIG. 4) and frame 240 (FIG. 3).

In the illustrative embodiment, floor-to-isolator attachment fasteners 460 is a bolt that includes a head and a threaded elongated body. As also shown, in one embodiment, a washer 526 (FIG. 5B) is provided below the head of floor-to-isolator attachment fasteners 460. Floor-to-isolator attachment fasteners 460 are received in attachment holes 462 in floor 328 and screwed into a threaded bore 524 (FIG. 5B), securing floor 328 to lower isolator 450. Isolator-to frame fasteners 466 extend through flange holes 468 and are received in third threaded holes 470 (FIG. 4) of lower cross-members 264 (FIG. 2) thereby coupling lower isolators 450 to lower cross-members 264 (FIG. 4) and frame 240 (FIG. 3).

Turning to FIG. 5B, lower isolators 450 further include elastomer 520 and insert 522. Insert 522 is located toward the center of lower isolator 450. Elastomer 520 surrounds insert 522 and is located between outer shell 510 and insert 522. In one embodiment, elastomer 520 can be formed from a resilient or elastic material such as rubber or plastic and insert 522 can be formed from metal. Insert includes a threaded bore 524 that is dimensioned to receive Floor-to-isolator attachment fastener 460. Threaded bore 524 includes an open end located at the top of lower isolator 450. Floor-to-isolator attachment fasteners 460 are extended through holes 462 (FIG. 4) in floor 328 and screwed into an open end 514 of threaded bore 524, securing floor 328 to lower isolator 450. With this assembly, floor 328 is effectively extended (and floats) atop/over a plurality of spaced isolators 450. When rack 280 is attached to floor 328 via L-shaped bracket 420 using bracket-to-floor fasteners 442 and holes 430 in floor, lower isolators 450 can dampen and absorb vibration and shock motion that originates from external movement of and/or force applied to MDC container 200, such as during transportation and shipping.

Figure 6:
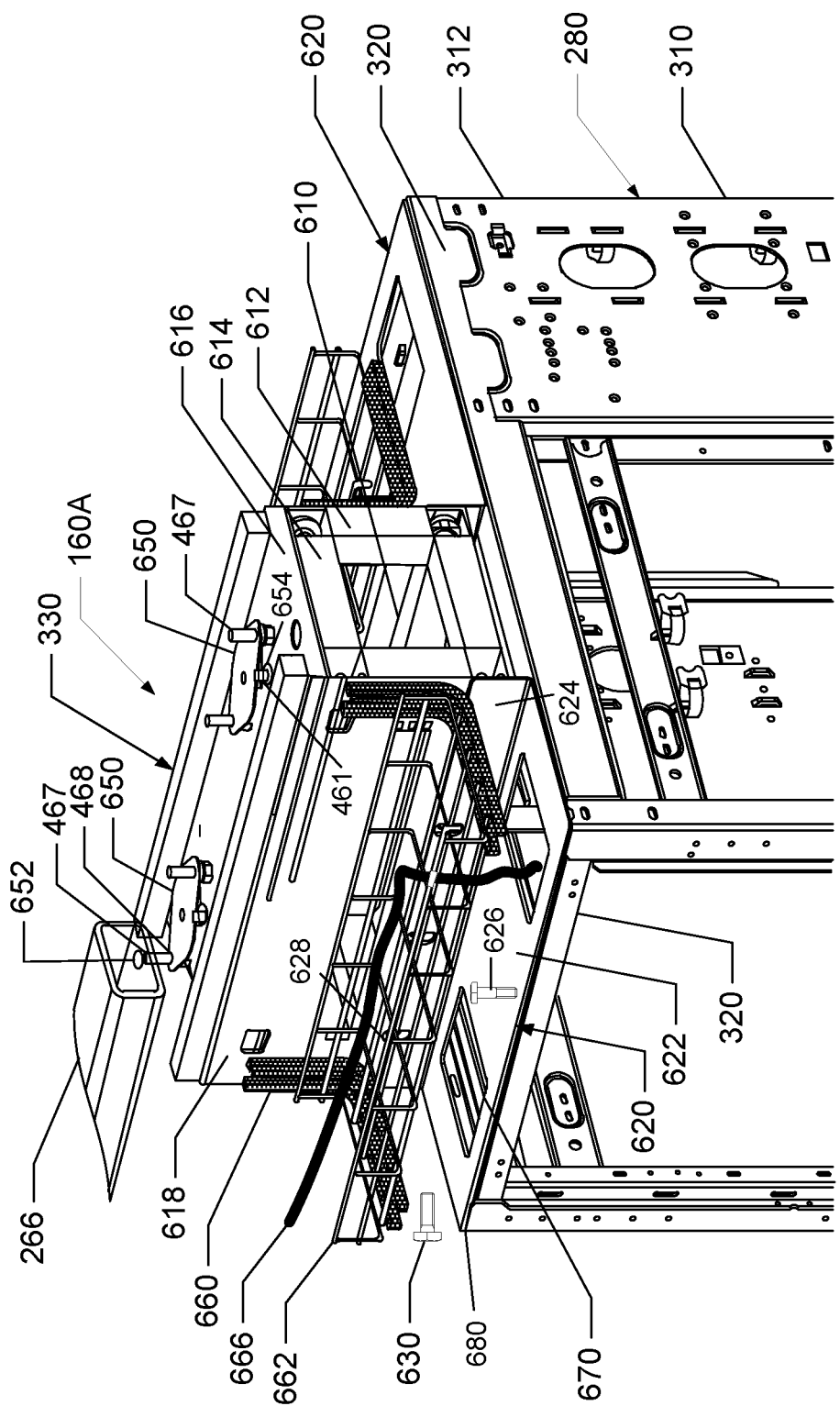
FIG. 6 illustrates an enlarged perspective view of the top of the rack of FIG. 3, attached to the upper SIVD system, according to one or more embodiments.

With reference now to FIG. 6, details of upper SIVD system 160A are shown. Upper SIVD system 160A includes isolator mounting assembly 330 mounted between top cross-bars 320 and upper cross-members 266. Isolator mounting assembly 330 extends across the width of rack 280. In one embodiment, isolator mounting assembly 330 comprises horizontal bars 610 that extend across the width of rack 280 and are joined together at each end by perpendicular vertical cross-bars 612 and horizontal cross-bars 614. Horizontal bars 610, vertical cross-bars 612 and horizontal cross-bars 614 can be formed from metal and can be joined by suitable means such as by welding or by using fasteners. Isolator mounting assembly 330 can be configured to allow racks of different heights to be attachable to isolator mounting assembly 330. The length of vertical bars in isolator mounting assembly 330 or the overall height of isolator mounting assembly 330 can be dimensioned to allow isolator mounting assembly 330 to be utilized to bridge the vertical gap for racks of different heights from the top 312 of rack chassis to the upper cross members 266. FIG. 1 illustrates the different heights of RIHSs and corresponding difference in the vertical height of respective SIVD systems. A top plate 616 is attached to the top of isolator mounting assembly 330 spanning between horizontal bars 610. Respective side plates 618 are attached to respective opposed sides of isolator mounting assembly 330.

In one embodiment, top surface 680 of rack 280 is coupled to isolator mounting assembly 330 by a pair of upper brackets 620. In another embodiment, cross-bars 320 of rack 280 is coupled to isolator mounting assembly 330 by upper brackets 620. Upper bracket 620 is generally L-shaped and includes a base segment 622 and an upright segment 624. Base segment 622 is attached to top surface 680 and/or top cross-bars 320 of chassis 310 using suitable means such as by welding or by using bracket to rack fasteners 626. Slots 628 are defined in upright wall 624. Threaded holes (not shown) are located in tubes 610. Bracket-to-isolator mounting assembly fasteners 630 extend through slots 628 and are received in the threaded holes of horizontal bars 610 in order to couple upper bracket 620 to isolator mounting assembly 330.

Several upper isolators 650 are mounted between a top surface 680 of isolator mounting assembly 330 and upper cross-members 266. Upper isolators 650 isolate or separate rack 280 from shock and vibration conveyed through upper cross-member 266 of frame 240 during movement or shipping of MDC container 200. In one or more embodiments, upper isolators 650 can have similar structure and components as previously described in FIGS. 5A-B for lower isolators 450. In alternate embodiments, a different type or structural/mechanical makeup of upper isolators can be utilized than that of lower isolators 450.

Threaded holes 652 are located in upper cross-members 266. Isolator mounting assembly-to-frame fasteners 467 extend through holes 468 of upper isolators 650 and are received in threaded holes 652, thereby coupling upper isolators 650 to upper cross-members 266. Holes 654 are located in top plate 616. Isolator mounting assembly-to-top plate fasteners 461 extend (from below) through holes 654 and are received in threaded bores 552 (FIG. 5B) of upper isolators 650, thereby coupling upper isolators 650 to isolator mounting assembly 330.

Upper brackets 620 further include several cutouts 670 that are positioned to support the routing and extending of power or signal cables 666 to and from an IHS or other IT equipment disposed in rack 280. Isolator mounting assembly 330 further includes a pair of cable tray brackets 660 attached to each side plate 618 on opposite sides of isolator mounting assembly 330. Cable tray brackets 660 can be attached to side plates 618 using suitable means such as by using fasteners. Cable tray brackets 660 are generally L-shaped and are dimensioned to support and be attached to cable trays 662. A cable tray 662 is located on each side of isolator mounting assembly 330. Cable tray 662 can be formed from suitable materials, such as wire. Cable tray 662 can be attached to cable tray brackets 660 by fasteners. Cable trays 662 are configured to hold at least one electrical or signal cable 666 of one or more IHS located in rack 280.

Figure 7A:
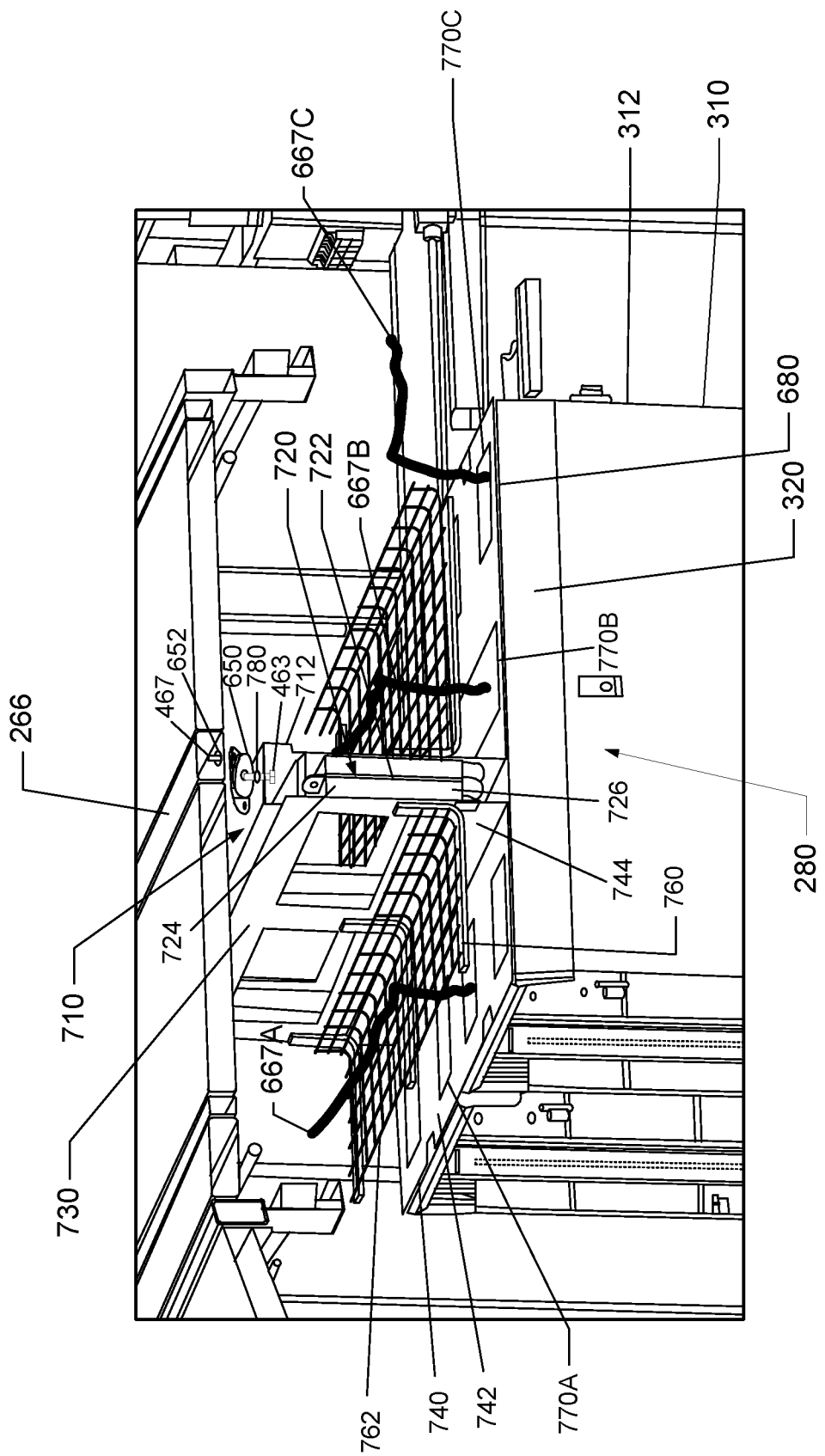
FIG. 7A illustrates an alternative embodiment of an isolator mounting assembly of the upper SIVD system coupled to a top of a rack, according to one or more embodiments.

Referring to FIG. 7A, an alternative isolator mounting assembly 710, having a much smaller form factor, is shown mounted to the top 312 of chassis 310. Isolator mounting assembly 710 is mounted between top surface 680 and/or top cross-bars 320 of chassis 310 and upper cross-members 266. Isolator mounting assembly 710 extends across the width of rack 280. Isolator mounting assembly 710 comprises header 712 that is coupled to strut assembly 720, which extends between header 712 and upper brackets 740 coupled to top of the rack/chassis. Header 712 is generally rectangular in shape and can be formed from metal.

With additional reference to FIG. 7B, several upper isolators 650 are mounted within header 712 below upper cross-members 266. Upper isolators 650 isolate or separate rack 280 from shock and vibration conveyed through upper cross-member 266 of frame 240 during movement or shipping of MDC container 200. Upper isolators 650 can have the same structure and components as previously described in FIGS. 5A-B for lower isolators 450. Isolator mounting assembly-to-frame fasteners 467 extend through holes 468 of upper isolators 650 and are received in holes or threaded holes 652 of upper cross-members 266. Holes 780 are located in header 712. Isolator mounting assembly-to-header fasteners 463 extend (from below) through holes 780 and are received in threaded bores 552 (FIG. 5B) of upper isolators 650, thereby coupling upper isolators 650 to isolator mounting assembly 710.

Strut assembly 720 includes several vertically-oriented struts 722 that are laterally spaced apart. Struts 722 include upper end connectors 724 that are attached to header 712 and the lower end connectors 726 (FIG. 7A) that are attached to upper brackets 740 (FIG. 7A). Struts 722 can be attached to header 712 and upper brackets 740 using fasteners. The length of struts 722 can be dimensioned to allow racks of different heights to be attachable to strut assembly 720. Strut assembly 720 includes a pair of side plates 730. Each of the side plates 730 is mounted to and extends across opposite sides of strut assembly 720 covering struts 722.

Figure 7B:
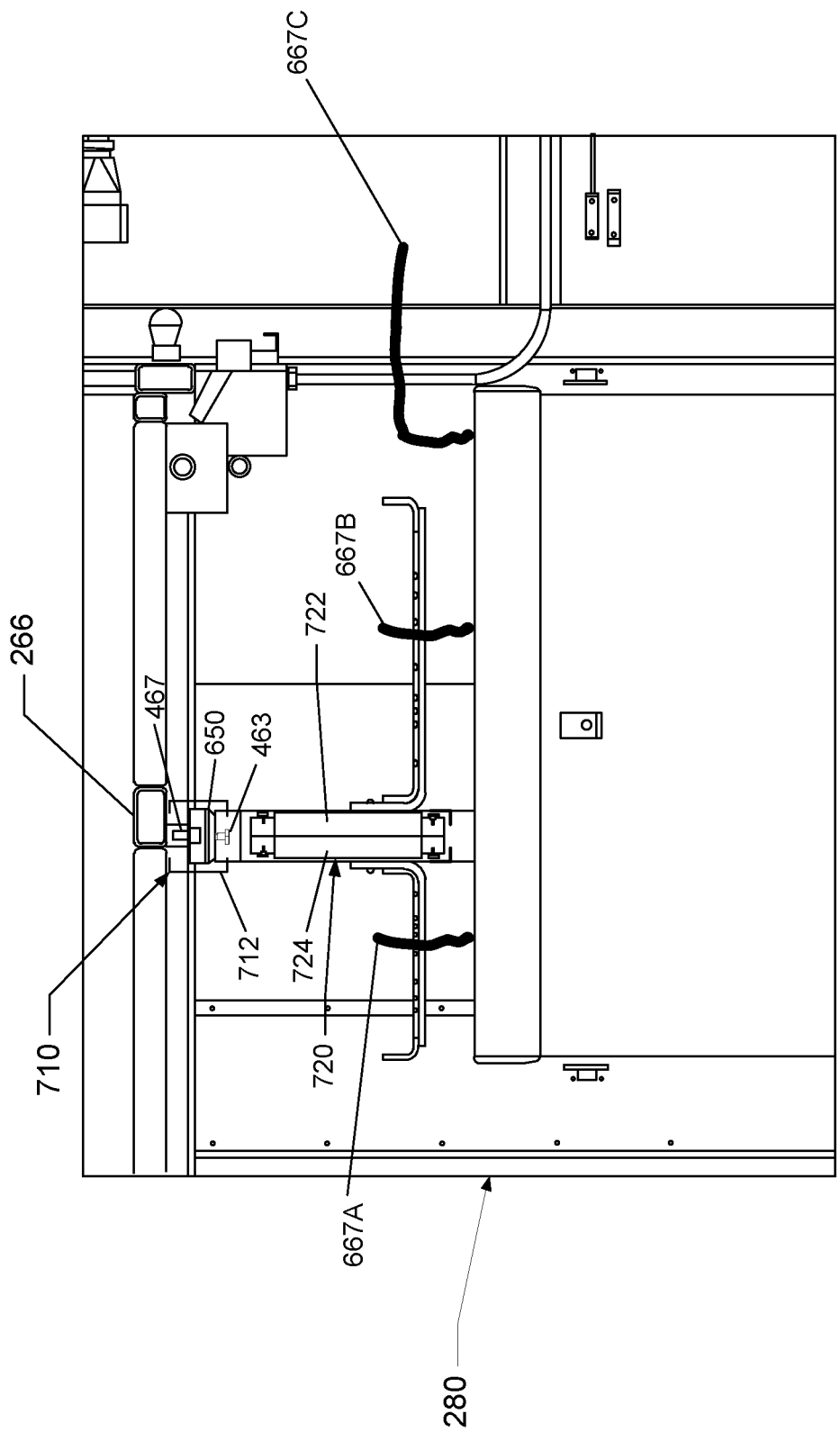
FIG. 7B illustrates a side view of the isolator mounting assembly of the upper SIVD system of FIG. 7A, according to one or more embodiments.

With continued reference to FIGS. 7A and 7B, in one embodiment, the top surface 680 and/or cross-bars 320 of rack 280 are coupled to strut assembly 720 by a pair of upper brackets 740. An upper bracket 740 is mounted to each side plate 730 and to lower end connector 726 of struts 722 on opposite sides of strut assembly 720. Upper bracket 740 is generally L-shaped and includes a base segment 742 and an upright segment 744. Base segment 742 is attached to top cross-bars 320 of chassis 310, using suitable means such as by welding or by using fasteners, such as nuts and bolts. Upper segment 744 is attached to struts 722 using suitable means such as by welding or by using fasteners, such as nuts and bolts. Alternatively, upper segment 744 can be attached to side plate 730 using suitable means such as by welding or by using fasteners, such as nuts and bolts.

Strut assembly 720 further includes a pair of cable tray brackets 760 attached to each side plate 730 on opposite sides of strut assembly 720. Cable tray brackets 760 can be attached to side plates 730 using suitable means such as using fasteners. Cable tray brackets 760 can are generally L-shaped and are dimensioned to support and be attached to cable trays 762. A cable tray 762 is located on each side of strut assembly 720. Cable tray 762 can be formed from suitable materials, such as wire. Cable tray 762 can be attached to cable tray brackets 760 by fasteners. Cable trays 762 are configured to hold electrical or signal cables 667A and 667B of one or more IHS located in rack 280. Cable trays 762 allow signal cable 667A to enter cutout 770A in the front of rack 280 and signal cable 667B to enter cutout 770B in the rear of rack 280. Power cable 667C enters cutout 770C in the rear of rack 280. Cable trays 762 are dimensioned such that they do not inhibit power cables 667C from being routed away from the cable tray (762).

Cutouts 770A-C are located in each of base segments 742 of upper brackets 740. Cutouts 770A-C allow for the routing and extending of electrical or signal cables 667A-C to and from an IHS disposed in rack 280. Cutouts 770A-C can also enable air flow within rack 280.

Figure 8:
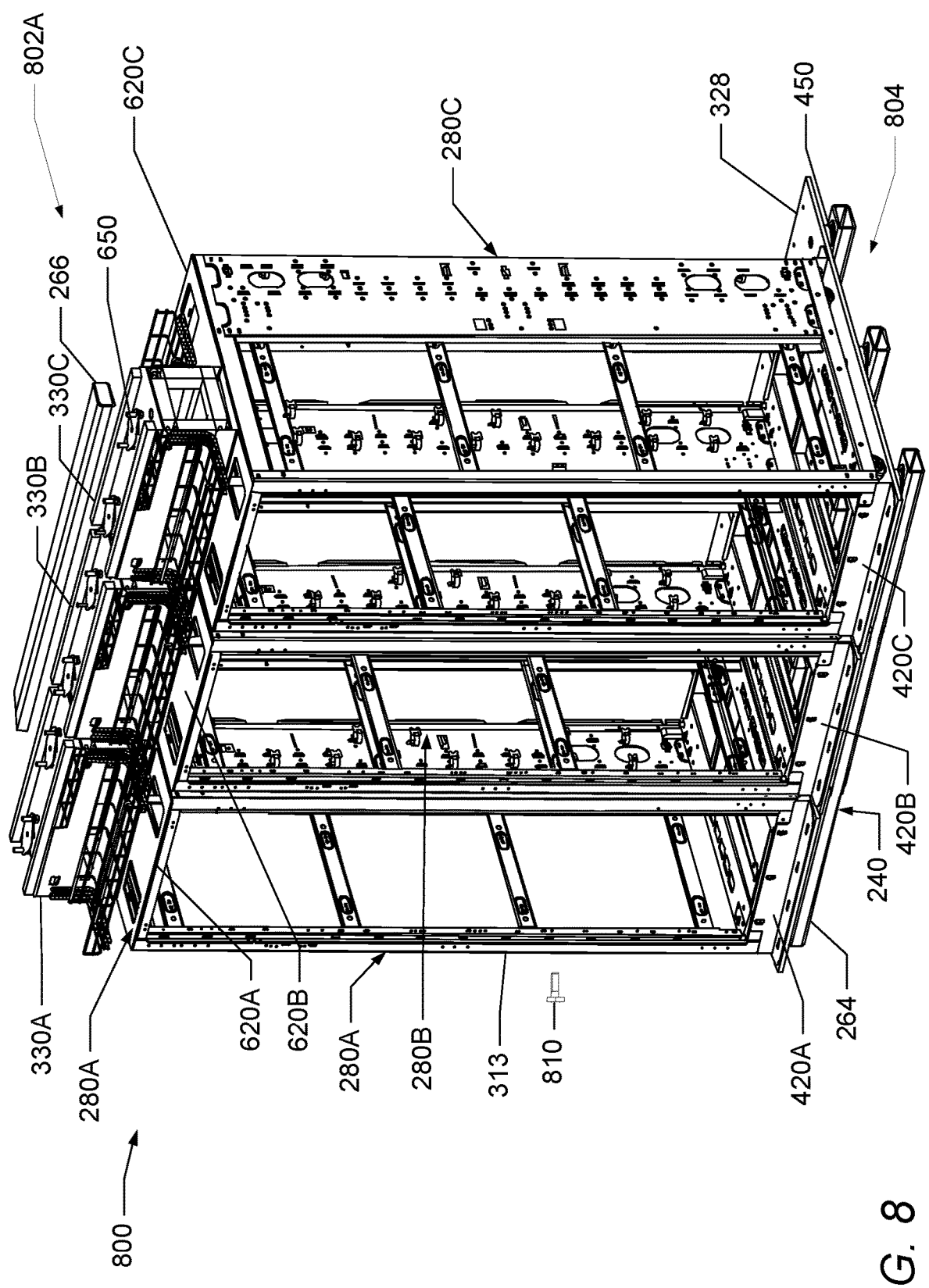
FIG. 8 illustrates a perspective view of several racks coupled to each other and to a frame of a MDC container via extended upper and lower SIVD systems, according to one or more embodiments.

FIG. 8 illustrates several racks coupled to each other and to a frame of a MDC container via upper and lower SIVD systems. Group of Racks 280A, 280B and 280C are coupled in tandem to an extended upper SIVD system 802 and mounted via lower brackets to floor 328 (including lower SIVD system 804). Three racks are shown in the tandem/group configuration; however, it is appreciated that the number of racks provided in such a tandem/group configuration can be two adjacent racks or any number of adjacent racks greater than two. Racks 280A, 280B and 280C within group of racks 800 are positioned adjacent each other on floor 328. In one embodiment, racks 280A, 280B and 280C can be coupled or attached to each other using fasteners 810 such as nuts and bolts or other suitable means. Fasteners 810 can extend through holes in columns 313 of adjoining racks. When coupled together, racks 280A, 280B and 280C form group of racks 800. In another embodiment, racks 280A, 280B and 280C can be separate individual racks.

Group of racks 800 can be coupled to floor 328 by one or more of lower brackets 420A, 420B and 420C mounted on opposite sides of group of racks 800. One or more of lower brackets 420A, 420B and 420C can be mounted to the front of group of racks 800 and one or more of lower brackets 420A, 420B and 420C can be mounted to the rear of group of racks 800. In one embodiment, lower brackets 420A, 420B and 420C can be joined together to form a single unitary lower bracket that spans across group of racks 800. Alternatively, a single one of the lower brackets, such as lower brackets 420B, can be used to couple group of racks 800 to floor 328 when the racks are joined to each other on the sides.

Group of racks 800 can be coupled to upper cross-member 266 of frame 240 by one or more of upper brackets 620A, 620B and 620C that are mounted on opposite sides of group of racks 800. In one embodiment, upper brackets 620A, 620B and 620C can be joined together to form (or be manufactured as) a single unitary upper bracket 620 that spans across group of racks 800. Alternatively, a single one of the upper brackets can used to couple group of racks 800 to upper cross-member 266 of frame 240 when the racks are joined to each other. Each of upper brackets 620A, 620B and 620C can be coupled to separate isolator mounting assemblies 330A, 330B and 330C. Alternatively, isolator mounting assemblies 330A, 330B and 330C can joined together to form a single unitary isolator mounting assembly that spans across group of racks 800.

Figure 9A:
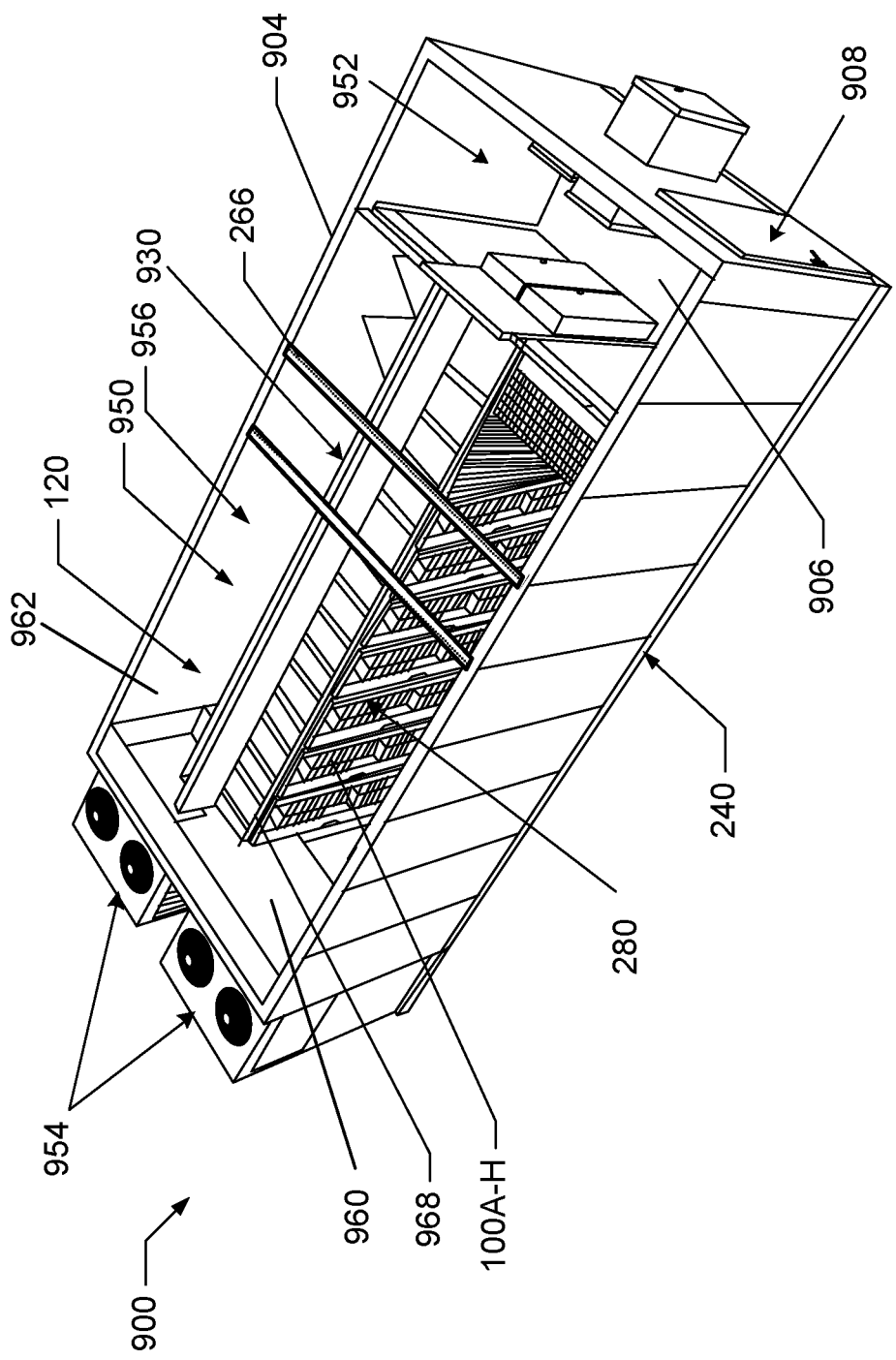
FIG. 9A illustrates a perspective view of an alternative embodiment of an MDC container with the top removed to expose an IT rack or rack information handling system (RIHS) oriented perpendicular to the length of the MCD container, according to one or more embodiments.
Figure 9B:
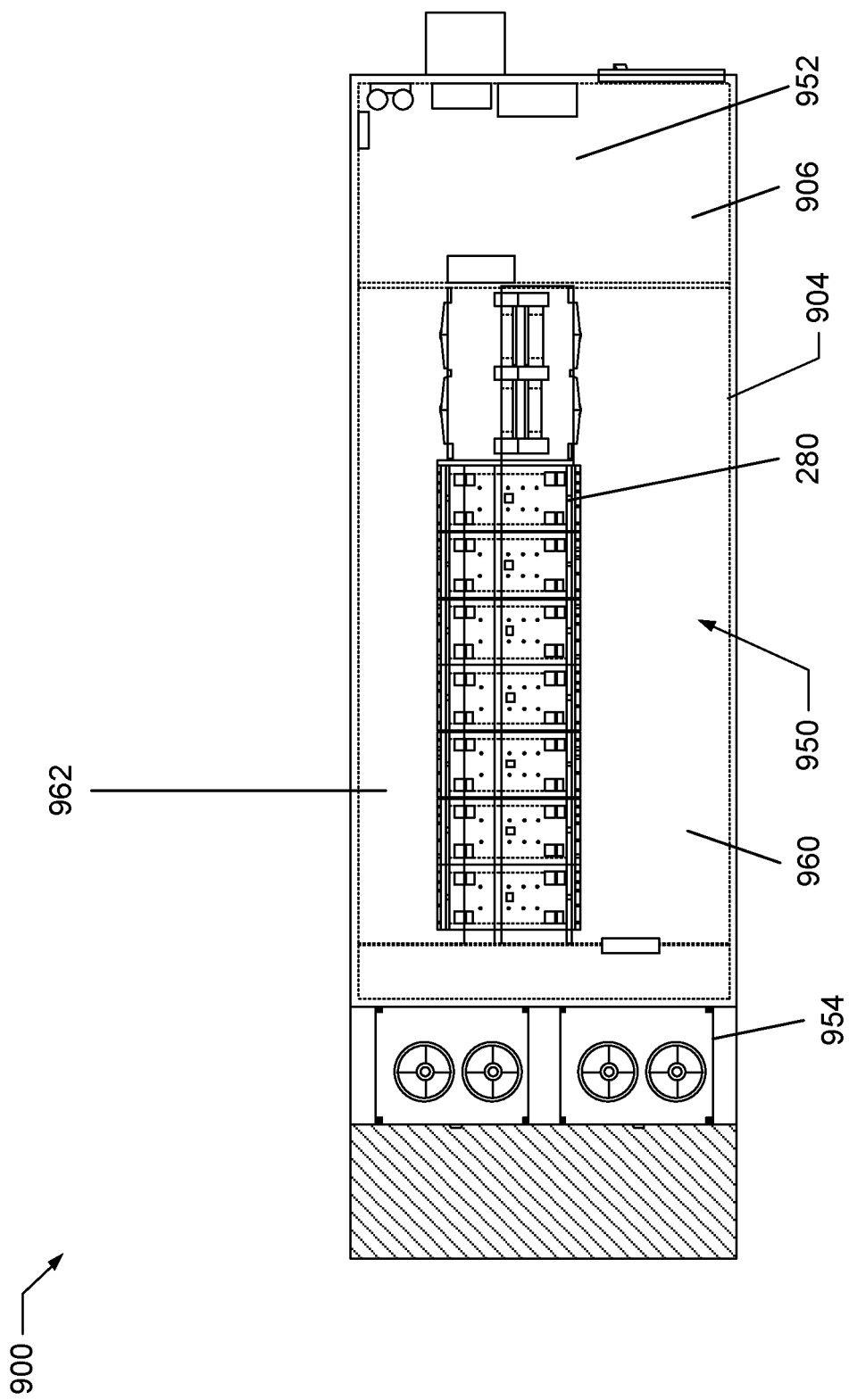
FIG. 9B illustrates a top view of the MDC container of FIG. 9A, according to one or more embodiments.

Referring to FIGS. 9A and 9B, another embodiment of an MDC container 900 is shown with a rack oriented perpendicular to the length of the MDC container. MDC container 900 can package and contain the various components of MDC 120 and the IHS racks. MDC container 900 includes frame 240, outer walls 904, floor 906, door 908 and a ceiling (not shown) that enclose interior space 950. MDC container 900 further includes power or utility room 952, cooling devices 954 and IHS rack room 956. Racks 280 are mounted on floor 906 within IHS rack room 956. Rack 280 can house or contain one or more IT equipment 110A-F and 112A-F, such as server IHS(s), and/or IHS components 108A-F of MDC 120. Racks 280 divide interior space 950 into a cold aisle 960 and a hot aisle 962. Cooling air from cooling devices 954 flows from cold aisle 960 through racks 280, and into hot aisle 962. The cooling air is warmed by the heat being dissipated by IHS components 108A-F as the cooling air passes through the racks 280.

In one embodiment, racks 280 are oriented with a front facing cold aisle 960 such that the IHS(s) components 108A-F face cold aisle 960. In another embodiment, racks 280 can be oriented perpendicular to cold aisle 960. Upper cross-members 266 extend across the top of MDC container 900. Upper isolator mounting assembly 930 is mounted between the top of racks 280 and upper cross-members 266.

Upper isolator mounting assembly 930 extends along the length of IHS rack room 956 and includes cable trays 968 for routing one or more electrical cables. Upper isolators (not shown) are mounted between upper isolator mounting assembly 930 and upper cross-members 266. Lower isolators (not shown) are mounted between floor 906 and lower cross-members (not shown) of frame 240.

Figure 9C:
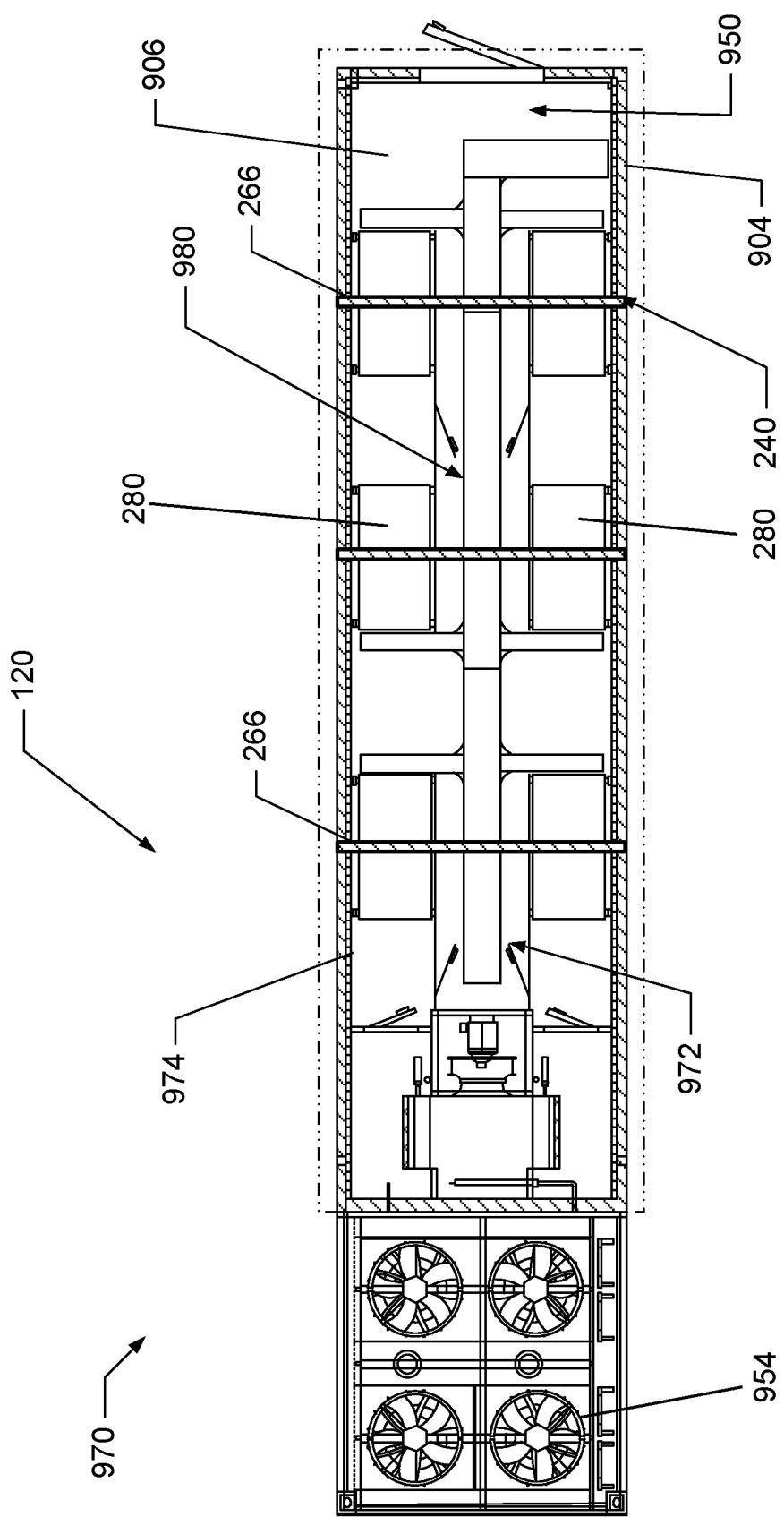
FIG. 9C illustrates a top view of an additional embodiment of an MDC container with the top removed to expose an IT rack or rack information handling system (RIHS) oriented parallel to the length of the MCD container, according to one or more embodiments.

With reference to FIG. 9C, another embodiment of an MDC container 970 is shown with a rack oriented perpendicular to the length of the MDC container. MDC container 970 can package and contain the various components of MDC 120 and IHS racks. MDC container 970 includes frame 240, outer walls 904, floor 906 and a ceiling (not shown) that enclose interior space 952 (FIG. 9B). MDC container 900 further includes cooling devices 954. Racks 280 are mounted on floor 906 within interior space 950. In one embodiment, racks 280 can be mounted against outer walls 904. Racks 280 can house or contain one or more IT equipment 110A-F and 112A-F, such as server IHS(s), and/or IHS components 108A-F of MDC 120. In one embodiment, racks 280 are mounted opposed to each other on opposed interior walls 974 within interior space 952 such that IHS(s) components 108A-F are oriented to face a center aisle 972. In another embodiment, racks 280 can be oriented perpendicular to center aisle 972.

Upper cross-members 266 extend across the top of MDC container 970. Upper isolator mounting assembly 980 is mounted between the top of racks 280 and upper cross-members 266. Upper isolator mounting assembly 980 extends along the length of MDC container 970. Upper isolators (not shown) are mounted between upper isolator mounting assembly 980 and upper cross-members 266. Lower isolators (not shown) are mounted between floor 906 and lower cross-members (not shown) of frame 240.

Figure 10:
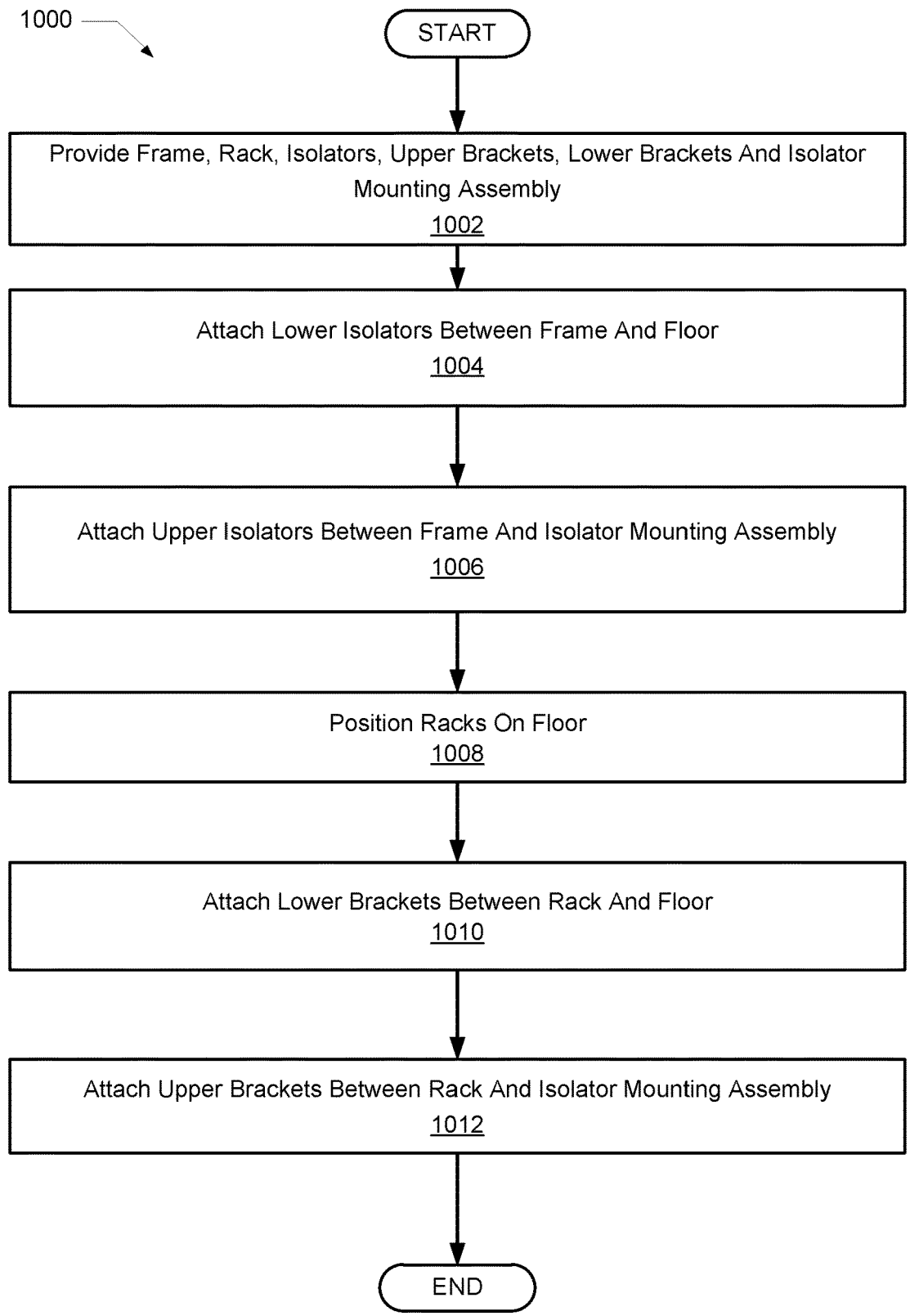
FIG. 10 is a flow chart illustrating an example method of assembling a MDC with IT racks coupled to upper and lower SIVD systems to support isolation of the IT racks from shock and vibrations during movement of the MDC, according to one or more embodiments.

FIG. 10 illustrates a flowchart of an exemplary method 1000 for manufacturing and/or assembling MDC 200 of the preceding figures. The description of the method is provided with general reference to the specific components illustrated within the preceding FIGS. 1-9C. In one embodiment, method 1000 can be implemented using automated assembly equipment or machines that are at least partially controlled by a controller or IHS. With specific reference to FIG. 10, method 1000 begins at the start block and proceeds to block 1002 where frame 240, floor 328, one or more racks 280, lower brackets 420, lower isolators 450, upper brackets 620, upper isolators 650 and isolator mounting assembly 330 are provided.

Lower isolators 450 are attached between floor 328 and lower cross-members 264 of frame 240 using lower isolator-to-cross-member fasteners (block 1004). Upper isolators 650 are attached between isolator mounting assembly 330 and upper cross-members 266 of frame 240 using isolator mounting-to-upper-cross-member fasteners (block 1006). One or more racks 280 are positioned or placed on floor 328 by rolling racks 280 via wheels 414 (block 1008). Lower brackets 420 are attached between floor 328 and racks 280 using respective lower bracket fasteners (block 1010). Upper brackets 620 are attached between isolator mounting assembly 330 and racks 280 using respective upper bracket fasteners (block 1012). Method 1000 concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular information handling system comprising:
   a container for housing at least one rack;
   a frame disposed within the container, the frame having a plurality of upper cross-members and a plurality of lower cross-members;
   a floor coupled to the lower cross-members, above the lower cross members, the at least one rack disposed on an upper surface of the floor;
   at least one lower bracket extending between and affixed to the floor and a first rack from among the at least one rack and coupling the first rack to the floor;
   at least one information processing equipment placed within the first rack;
   a plurality of first isolators mounted below the floor, between the floor and the lower cross-members, the plurality of first isolators protecting the at least one information processing equipment within the first rack from mechanical shock and vibration;
   an isolator mounting assembly disposed between the upper cross-members and a top of the first rack;
   at least one upper bracket extending between the isolator mounting assembly and the first rack, the at least one upper bracket coupling the first rack to the isolator mounting assembly; and
   a strut assembly coupled between the isolator mounting assembly and the at least one upper bracket, the strut assembly configured to allow racks of different heights to be attachable to the isolator mounting assembly.

2. The modular information handling system of claim 1, wherein each first isolator further comprises:
   a first elastomer coupled between the first outer shell and the first insert.

3. The modular information handling system of claim 2, wherein:
   a second fastener couples the lower flanged section of the outer shell to one of the plurality of lower cross-members.

4. The modular information handling system of claim 1, further comprising:
   at least one second isolator mounted between the isolator mounting assembly and the upper cross-members, wherein the at least one second isolator further protects the first rack from mechanical shock and vibration.

5. The modular information handling system of claim 4, further comprising:
   at least one second rack, the first rack and the at least one second rack coupled to each other and forming a group of adjacent racks, the group of adjacent racks affixed to the floor via the at least one lower bracket and affixed to the isolator mounting assembly via the at least one upper bracket, the first isolators and the second isolators protecting the group of adjacent racks from mechanical shock and vibration.

6. The modular information handling system of claim 4, wherein the at least one upper bracket further comprises at least one cutout for extending cables to and from the information handing system disposed in the first rack.

7. The modular information handling system of claim 4, wherein each second isolator further comprises:
   a second outer shell having a top section and a lower flanged section with at least one flange hole disposed therein;
   a second insert disposed within the top section of the second outer shell, the second insert having a second threaded bore therein for receiving at least one third fastener; and
   a second elastomer coupled between the second outer shell and the second insert.

8. The modular information handling system of claim 1, wherein the strut assembly further comprises:
   a plurality of struts each having a first end and a second end, the first ends coupled to the isolator mounting assembly and the second ends coupled to the at least one upper bracket.

9. The modular information handling system of claim 8, further comprising:
   at least one plate affixed to at least one of (i) the struts and (ii) the isolator mounting assembly; and at least one cable tray coupled to the at least one plate, the cable tray configured to hold at least one cable of the information handing system.

10. A modular data center comprising:
a container for housing at least one rack containing an information handling system;
a frame disposed within the container, the frame having a plurality of upper cross-members and a plurality of lower cross-members;
a floor coupled to the lower cross-members above the lower cross-members, the at least one rack comprising a first rack disposed on an upper surface of the floor;
an isolator mounting assembly disposed between the upper cross-members and a top of the first rack;
at least one upper bracket extending between the isolator mounting assembly and the first rack, the at least one upper bracket coupling the first rack to the isolator mounting assembly;
a strut assembly coupled between the isolator mounting assembly and the at least one upper bracket, the strut assembly configured to allow racks of different heights to be attachable to the isolator mounting assembly; and
at least one second isolator mounted between the isolator mounting assembly and the upper cross-members, wherein the at least one second isolator further protects the first rack from mechanical shock and vibration.

11. The modular data center of claim 10, further comprising:
at least one lower bracket extending between and affixed to the floor and a first rack from among the at least one rack and coupling the first rack to the floor; and
a plurality of first isolators mounted below the floor, between the floor and the lower cross-members, the plurality of first isolators protecting the first rack from mechanical shock and vibration.

12. The modular data center of claim 11, wherein each first isolator further comprises:
a first elastomer coupled between the first outer shell and the first insert.

13. The modular data center of claim 12, further comprising:
a second fastener that couples the lower flanged section of the outer shell to one of the plurality of lower cross-members.

14. The modular data center of claim 11, further comprising:
at least one second rack, the first rack and the at least one second rack coupled to each other and forming a group of adjacent racks, the group of adjacent racks affixed to the floor via at least one lower bracket and affixed to the isolator mounting assembly via the at least one upper bracket, first isolators and the at least one second isolator protecting the group of adjacent racks from mechanical shock and vibration.

15. The modular data center of claim 10, wherein the at least one upper bracket further comprises at least one cutout for extending cables to and from the information handing system disposed in the first rack.

16. The modular data center of claim 10, wherein the strut assembly further comprises:
a plurality of struts each having a first end and a second end, the first ends coupled to the isolator mounting assembly and the second ends coupled to the at least one upper bracket.

17. The modular data center of claim 16, further comprising:
at least one plate affixed to at least one of (i) the struts and (ii) the isolator mounting assembly; and
at least one cable tray coupled to the at least one plate, the cable tray configured to hold at least one cable of the information handing system.

18. A method of manufacturing a modular data center, the method comprising:
providing a frame having lower cross-members and upper cross members;
providing a floor, a plurality of first isolators, a plurality of second isolators, an isolator mounting assembly, a strut assembly, at least one upper bracket and at least one lower bracket;
attaching the first isolators between the lower cross-members of the frame and the floor, the floor extending atop the first isolators;
attaching the second isolators between the frame and the isolator mounting assembly;
coupling the strut assembly between the isolator mounting assembly and one of the at least one upper bracket, the strut assembly configured to allow racks of different heights to be attachable to the isolator mounting assembly;
positioning a rack into the frame and onto the floor, the rack disposed on an upper surface of the floor;
coupling the lower bracket between the rack and the floor; and
coupling the upper bracket between the rack and the isolator mounting assembly;
wherein the first isolators and the second isolators protect IT equipment placed within the rack from mechanical shock and vibration.

* * * * *